United States Patent [19]

Jansen et al.

[11] Patent Number: 4,896,195

[45] Date of Patent: Jan. 23, 1990

[54] SUPERLUMINESCENT DIODE

[75] Inventors: Michael Jansen, Los Angeles; Moshe Sergant, Culver City; Szutsun S. Ou, Manhattan; Jaroslava Z. Wilcox; Jane J. Yang, both of Los Angeles; Larry R. Eaton, Huntington Beach, all of Calif.

[73] Assignee: TRW Inc., Redondo Beach, Calif.

[21] Appl. No.: 168,067

[22] Filed: Mar. 14, 1988

[51] Int. Cl.$^4$ .................... H01L 33/00; H01S 3/19
[52] U.S. Cl. ......................... 357/17; 330/4.3; 372/45; 372/108; 350/96.17
[58] Field of Search ............. 372/45, 44, 50, 108; 357/17; 350/96.17, 96.20; 330/4.3

[56] References Cited

U.S. PATENT DOCUMENTS

| | | | |
|---|---|---|---|
| 3,996,492 | 12/1976 | McGroddy | 372/44 |
| 3,996,528 | 12/1976 | Blum et al. | 372/44 |
| 4,163,953 | 8/1979 | Springthorpe et al. | 372/50 |
| 4,216,485 | 8/1980 | Page | 372/50 |
| 4,633,476 | 12/1986 | Scifres et al. | 372/50 |
| 4,730,331 | 3/1988 | Burnham et al. | 372/50 |
| 4,760,578 | 7/1988 | Oshima et al. | 372/45 |

Primary Examiner—James W. Davie
Attorney, Agent, or Firm—Noel F. Heal; Sol L. Goldstein

[57] ABSTRACT

A semiconductor diode structure including a light-absorbing substrate, an active region, and a pair of cladding layers surrounding the active region. Lasing is inhibited by means of an inclined end facet, which reflects light down into the substrate, where it is absorbed, to provide only one pass of the spontaneously emitted light through the active region. One disclosed embodiment has a conventional end facet for the outcoupling of edge-emitted light. Another embodiment includes a surface-emitting facet formed in an opening in the substrate adjacent to the inclined facet. Yet another embodiment has two inclined facets. One inclined facet may serve to reflect light into the absorbing substrate, or both may serve to reflect light through separate surface emitting facets.

13 Claims, 1 Drawing Sheet

SUPERLUMINESCENT DIODE

BACKGROUND OF THE INVENTION

This invention relates generally to semiconductor laser diode structures and, more particularly, to superluminescent diodes. By way of background, a semiconductor laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes combine in the region of the active layer, and light is emitted. The layers on each side of the active layer have a lower index of refraction than the active layer, and function as cladding layers to confine the light in the plane of the active layer. Various techniques are used to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in the plane of the active layer.

The output of a laser diode is generally monochromatic and coherent, and results from the stimulated emission of light from the active layer and the repeated reflections between the laser facets. For some applications, coherent light is not required and a broader spectrum of radiation is obtained. When a diode structure is configured to produce spontaneous, but not stimulated, light emission over a broad range of wavelengths, it is referred to as a superluminescent diode, or SLD. High power SLDs with wide spectral bandwidths are needed for a number of applications, such as fiber-optic gyroscopes. There is also a need in some applications for SLDs of narrower bandwidth, but still not operating as lasers.

The difficulty with designing an SLD is to devise a technique that will effectively suppress lasing. Because the structure typically has to include end facets for the emission of light, there is a natural tendency for light to be repeatedly reflected between the facets, and for the device to stabilize its operation in one or a small number of longitudinal modes of oscillation. Existing designs for SLDs typically employ antireflective coatings on the end facets, to suppress repeated reflections through the gain region of the device. Other designs have suggested non-uniformities in the active layer to inhibit lasing. However, as a practical matter it is very difficult to design and fabricate a high-power SLD that will not inadvertently revert to lasing operation. The present invention overcomes this difficulty.

SUMMARY OF THE INVENTION

The present invention resides in a high-power SLD structure in which spontaneously emitted light makes only one pass through the active region of the device. Spectral narrowing can be achieved in the same type of structure by lengthening the active region, but still permitting only one pass, and thereby inhibiting the stimulated emission of light.

Briefly, and in general terms, the SLD structure of the invention comprises a semiconductor diode structure, including a light-absorbing substrate, an active region, means for connecting an electrical power source across the active region to produce spontaneous emission of light, and means for laterally guiding emitted light in the structure, such that the emitted light is substantially in a longitudinal direction. Importantly, the structure of the invention includes at least one end facet that is inclined to a plane perpendicular to the longitudinal direction, to reflect light impinging on it into the substrate. Spontaneously emitted light makes only one pass through the active region and is either emitted or reflected into the substrate and absorbed.

One version of the invention includes a second end facet oriented perpendicular to the longitudinal direction to act as an output facet, the second end facet being coated with an antireflective material to minimize reflection back into the active region. Another embodiment of the invention has an opening formed in the substrate adjacent to the inclined facet, to permit convenient coupling of an optical fiber, and a surface emitting facet formed in the opening. Light reflected from the inclined facet is emitted through the surface emitting facet, which is also coated with an antireflective material.

Another embodiment has a second end facet oriented perpendicular to the longitudinal direction to act as an output facet, the second end facet being coated with an antireflective material to minimize reflection back into the active region. Various combinations are possible, using one or two inclined facets, in conjunction with a surface-emitting facet in a substrate opening, or in conjunction with light-absorbing material in the substrate.

It will be appreciated that the invention represents a significant advance in the field of SLDs. In particular, the invention provides an SLD structure in which emitted light makes only one pass through the active region, thereby minimizing stimulated emission of light. Other aspects and advantages of the invention will become apparent from the following more detailed description, taken in conjunction with the accompanying drawings.

DESCRIPTION OF THE PREFERRED EMBODIMENTS

Figure 1:
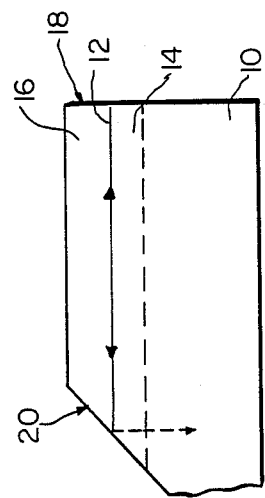
FIG. 1 is a simplified cross-sectional view of an SLD in accordance with the invention.

As shown in the drawings for purposes of illustration, the present invention is concerned with superluminescent diodes (SLDs). In the past, suppression of lasing in SLDs has been achieved by the use of antireflective coatings on end facets of the structures, to inhibit repeated reflections through the active region. These have never been completely satisfactory since, especially at higher powers, reflections can not be totally suppressed, and unwanted spectral narrowing and lasing can occur.

In accordance with the invention, longitudinally directed light in the active region is reflected out of the active region by at least one inclined facet. FIG. 1 shows an SLD structure in accordance with the invention, including a substrate, indicated by reference numeral 10, an active region 12, and two cladding layers 14 and 16. The structure includes one conventional output facet 18 formed perpendicular to the longitudinal direction of light propagation in the active region 12, and one inclined facet 20. The inclined facet may be conveniently formed at 45 degrees to the plane of the active region 12, such that light impinging on the facet will be reflected down into the substrate 10, which is selected to be a light-absorbing material. The conventional facet 18 preferably has an antireflective coating to inhibit any reflections back into the active region 12. The device is a single-pass one because spontaneously emitted light striking the inclined facet 20 will be absorbed in the substrate 10, and only a small proportion of the light will be reflected back into the active region, and this will be absorbed in the substrate without making an additional pass of the active region.

If the application calls for it, the spectral bandwidth of light emitted from the conventional facet 18 can be narrowed by merely lengthening the structure longitudinally. A greater longitudinal dimension will result in a narrower spectral bandwidth, but without stimulated emission and lasing of the device.

Figure 2:
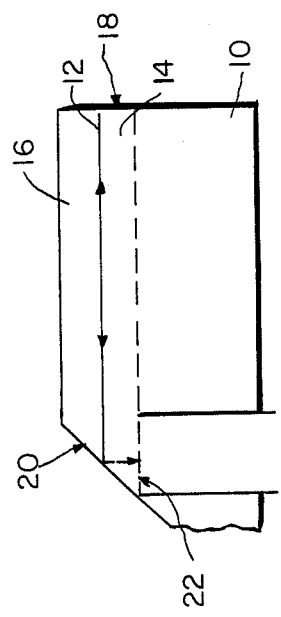
FIGS. 2-4 are similar cross-sectional views, showing alternative configurations of the invention.

In the embodiment of FIG. 2, a portion of the substrate beneath the inclined facet 20 is removed to form a surface-emitting facet 22, which is preferably coated with an antireflective coating. The resulting opening in the substrate of the device can be used to accommodate an optical fiber for the input or output of light. For example, light can be input through the facet 22, amplified in the SLD structure of the invention, and output through the perpendicular facet 18. Alternatively, light can be emitted through both facets 18 and 22. In either case, the device is still essentially a one-pass structure.

Figure 3:
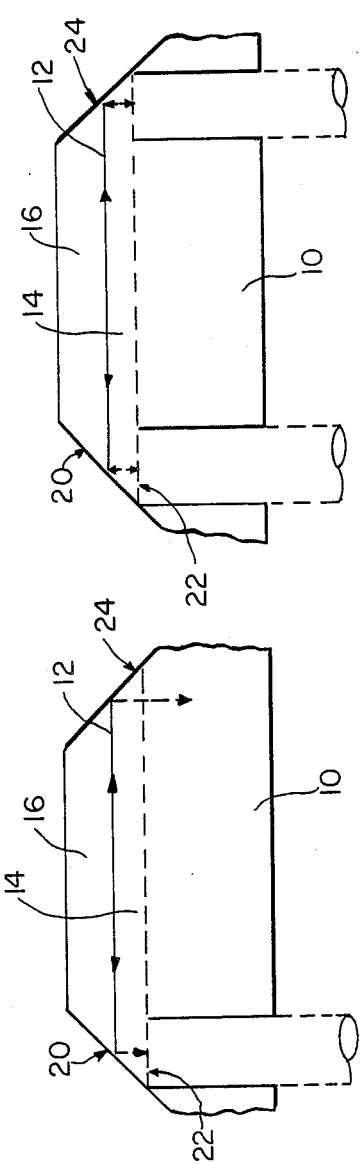

In the embodiment of FIG. 3, the facet 18 of FIG. 2 has been replaced by another inclined facet 24, to reflect light into the substrate 10, for absorption. Basically, this a surface emitting version of the one shown in FIG. and is convenient for coupling to optical fibers.

Figure 4:
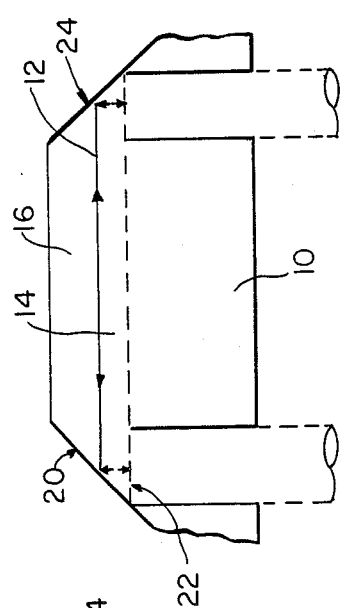

In the embodiment of FIG. 4, the portion of the substrate material beneath the second inclined facet 24 of the FIG. 3 version has also been removed, to accommodate a second fiber channel. This configuration may used in a number of ways. One fiber may provide an input signal, and the other carry an amplified output signal. Alternatively, the device may provide two surface-emitting ports for coupling to two fibers.

It will be appreciated from the foregoing that the present invention represents a significant advance in the field of SLDs. In particular, the invention provides a high-power SLD structure in which spontaneously emitted light makes only one pass of the active region and the potential for stimulated emission of light is kept to a minimum by a simple but effective arrangement including at least one inclined facet. It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A superluminescent diode, comprising:
a semiconductor diode structure including a light-absorbing substrate, an active region, means for connecting an electrical power source across the active region to produce spontaneous emission of light, and means for laterally guiding emitted light in the structure, such that the emitted light substantially follows a longitudinal direction; and
at least one end facet that is inclined to a plane perpendicular to the longitudinal direction, to reflect light impinging on it into the substrate;
wherein spontaneously emitted light makes only one pass through the active region and is either emitted or reflected into the substrate and absorbed.

2. A superluminescent diode as defined in claim 1, and further comprising:
a second end facet oriented perpendicular to the longitudinal direction to act as an output facet.

3. A superluminescent diode as defined in claim 1, and further comprising:
an opening formed in the substrate adjacent to the inclined facet, to permit convenient coupling of an optical fiber; and
a surface emitting facet formed in the opening;
wherein light reflected from the inclined facet is emitted through the surface emitting facet.

4. A superluminescent diode as defined in claim 3, and further comprising:
a second end facet oriented perpendicular to the longitudinal direction to act as an output facet, the second end facet being coated with an antireflective material to minimize reflection back into the active region.

5. A superluminescent diode as defined in claim 3, and further comprising:
a second inclined facet formed at the opposite end of the active region from the first inclined facet, to reflect light impinging on it down toward the substrate.

6. A superluminescent diode as defined in claim 5, wherein:
light reflected from the second inclined facet is absorbed in the substrate.

7. A superluminescent diode as defined in claim 5, and further comprising:
a second opening formed in the substrate adjacent to the second inclined facet, to permit convenient coupling of an optical fiber; and
a second surface emitting facet formed in the opening;
wherein light reflected from the second inclined facet is emitted through the second surface emitting facet, which is coated with an antireflective material.

8. A superluminscent diode as defined in claim 2, wherein:
the second end facet is coated with an antireflective material to minimize reflection back into the active region.

9. A superluminscent diode as defined in claim 3, wherein:
the surface emitting facet is also coated with an antireflective material.

10. A superluminescent diode as defined in claim 9, and further comprising:
a second end facet oriented perpendicular to the longitudinal direction to act as an output facet, the second end facet being coated with an antireflective material to minimize reflection back into the active region.

11. A superluminescent diode as defined in claim 1, and further comprising:
two optical input/output ports for inputting an optical signal into the active region and for outputting an amplified optical signal from the active region, at least one of the ports including a facet that is substantially parallel to the active region.

12. An optical amplifier as defined in claim 11, wherein:

the other of the optical input/output ports includes a facet that is perpendicular to the longitudinal direction; and at least one of the optical input/output ports includes an antireflective coating to minimize reflections back into the active region.

13. An optical amplifier as defined in claim 11, wherein:

the other of the optical input/output ports includes a facet that is parallel with the plane of the active layer; and at least one of the optical input/output ports includes an antireflective coating to minimize reflections back into the active region.

* * * * *